(12) United States Patent
Kim et al.

(10) Patent No.: US 8,481,429 B2
(45) Date of Patent: Jul. 9, 2013

(54) METHOD OF MANUFACTURING SEMICONDUCTOR DEVICE

(75) Inventors: Jae Heon Kim, Seoul (KR); Cheol Kyu Bok, Icheon-si (KR)

(73) Assignee: Hynix Semiconductor Inc., Icheon (KR)

( * ) Notice: Subject to any disclaimer, the term of this patent is extended or adjusted under 35 U.S.C. 154(b) by 8 days.

(21) Appl. No.: 13/347,531

(22) Filed: Jan. 10, 2012

(65) Prior Publication Data

US 2012/0289051 A1 Nov. 15, 2012

(30) Foreign Application Priority Data

May 12, 2011 (KR) .................. 10-2011-0044743

(51) Int. Cl.
*H01L 21/3105* (2006.01)
(52) U.S. Cl.
USPC ............ 438/702; 257/E21.241; 257/E21.242; 257/E21.257; 257/E21.259; 257/E21.24
(58) Field of Classification Search
USPC ............... 257/E21.241, E21.231, E21.232, 257/E21.233, E21.242, E21.257, E21.259, 257/E21.24
See application file for complete search history.

(56) References Cited

U.S. PATENT DOCUMENTS

| 2008/0166638 A1* | 7/2008 | Jung et al. ................. 430/4 |
| 2009/0042146 A1* | 2/2009 | Kim et al. ................ 430/323 |
| 2009/0200646 A1* | 8/2009 | Millward et al. .......... 257/632 |
| 2011/0186544 A1* | 8/2011 | Endou et al. ............... 216/58 |

FOREIGN PATENT DOCUMENTS

| JP | 2010-115832 A | 5/2010 |
| KR | 1020090015742 A | 2/2009 |
| KR | 10-2009-0080395 A | 7/2009 |
| KR | 1020100112196 A | 10/2010 |
| WO | WO 2010/133422 A2 | 11/2010 |

* cited by examiner

*Primary Examiner* — Benjamin Sandvik
*Assistant Examiner* — Rodolfo Fortich (57) ABSTRACT

A method of manufacturing a semiconductor device is provided. According to an embodiment, the method includes forming a layer to be etched on a semiconductor substrate, and forming a photoresist pattern on the layer to be etched. A block copolymer including a hydrophobic radical and a hydrophilic radical is formed in the photoresist pattern, and the block copolymer is assembled to allow a polymer having the hydrophobic radical to be formed in a pillar pattern within a polymer having the hydrophilic radical. The polymer having the hydrophobic radical is then selectively removed.

17 Claims, 7 Drawing Sheets

METHOD OF MANUFACTURING SEMICONDUCTOR DEVICE

CROSS-REFERENCES TO RELATED APPLICATION

The present application claims priority to Korean patent application number 10-2011-0044743, filed on 12 May 2011, which is incorporated by reference in its entirety.

BACKGROUND OF THE INVENTION

1. Technical Field

The inventive concept relates to a method of manufacturing a semiconductor device, and more particularly, to a method of manufacturing a semiconductor device using self-assembling polymer.

2. Related Art

A semiconductor industry requires desires to fabricate an integrated circuit (IC) having a higher integration density to obtain excellent performance and reduce a fabrication cost. With an increase in the degree of integration, a two-dimensional area occupied by each unit cell is reduced.

In response to reduction in an area of the unit cell, a design rule of several to several tens of nanometer which has a critical dimension of a nano scale is applied. Thus new technology for forming a fine pattern such as a fine contact hole pattern having an opening size of a nano scale and a fine line pattern having a nano-scale width, has been required.

A size of a structure such as a gate in a field effect transistor can be reduced by photolithographic technology.

The photolithographic process uses a principle in which a specific chemical material (photoresist) is chemically reacted by exposure to light to change its property. That is, the photolithographic process is a process of forming a pattern by selectively radiating light into the photoresist using a mask of a desired pattern.

The photolithographic process includes a coating process of coating a photoresist corresponding to a film of a photograph, an exposure process of selectively radiating light into the photoresist using a mask, and a development process of forming a pattern by removing or leaving a portion of the photoresist in which the light is radiated using a developer. The photoresist may be a positive photoresist or a negative photoresist. The photoresist may be a silicon (Si)-containing dry-developed resist. In the case of a positive PR, a photochemical reaction occurs in the photoresist exposed to light.

A pattern size obtained by a photolithographic process depends on a wavelength of light employed for an exposure process. Recent photolithographic processes use a short-wavelength light source such as KrF and ArF. Since the resolution of a pattern obtained from the short-wavelength light source is restricted around 0.1 μm, there is a limit to fabricate a high integration semiconductor device having a fine pattern of below the resolution. For example, performance degrades by aberration, focus, and an approximate effect when the light source is used.

In particular, a photoresist reflow process is performed to reduce a size of the contact hole pattern. However, the photoresist reflow process allows non-uniform photoresist at upper and at central portions of the photoresist. Thus, when a contact hole is formed using this method, the hole diameter at the upper portion of the photoresist becomes greater than that of the lower portion thereof, making difficult to obtain a desired hole pattern size.

A Resist Enhancement Lithography Assisted by Chemical Shrink (RELACS) process is also used as a method for forming a fine pattern. However, material used in this method is expensive. Also, a water-soluble polymer used in the RELACS process is not completely removed, but left on the pattern as a development residue to affect a subsequent etching process. Therefore, the RELACS process may degrade yield of a process and reliability of the semiconductor device.

As described above, it is difficult to increase integration of the semiconductor device due to technological limitation inherent to development of exposure equipment. The photoresist reflow process or the RELACS process in the related art can reduce a contact hole pattern size, but it is hard to control the pattern size or may generate other technical issues. In addition, it is desirable to form patterns uniformly in order to reduce approximate effect and improve a production yield.

SUMMARY

According to one aspect of an exemplary embodiment, a method of manufacturing a semiconductor device is provided. The method includes forming a layer to be etched on a semiconductor substrate, forming a photoresist pattern on the layer to be etched, forming a block copolymer including a hydrophobic radical and a hydrophilic radical in the photoresist pattern, assembling the block copolymer to allow the polymer having the hydrophobic radical to be formed in a pillar pattern within the polymer having the hydrophilic radical, and selectively removing the polymer having the hydrophobic radical.

The forming the layer to be etched may include forming an amorphous carbon layer on the semiconductor substrate and forming a polysilicon layer on the amorphous carbon layer.

The method may further include an antireflective coating (ARC) layer on the layer to be etched after the forming the layer to be etched.

The photoresist pattern may include contact hole patterns.

The forming the photoresist pattern may include forming the photoresist pattern to connect adjacent contact hole patterns.

The pillar pattern may include a circular pattern.

The forming the photoresist pattern may include coating a photoresist layer on the layer to be etched and performing an exposure and development process using an exposure mask including contact hole patterns.

The photoresist pattern may include a rectangular ring pattern.

The pillar pattern may include a line pattern.

The assembling the block copolymer may include performing a bake process at a temperature of 100° C. to 200° C.

The method may further include forming a final pattern by etching the layer to be etched using the hydrophilic polymer as a mask after the selectively removing the polymer having the hydrophobic radical.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

of FIGS. 1 to 5 are plan views and (ii) of FIGS. 1 to 5 are cross-sectional views taken lines X-X' of (i) of FIGS. 1 to 5.

DESCRIPTION OF EXEMPLARY EMBODIMENT

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Hereinafter, a method of manufacturing a semiconductor device according to an exemplary embodiment of the inventive concept will be described in further detail with reference to accompanying drawings.

FIGS. 1 to 5 are cross-sectional views illustrating a method of manufacturing a semiconductor device according to an exemplary embodiment of the inventive concept, wherein (i) of FIGS. 1 to 5 are plan views and (ii) of FIGS. 1 to 5 are cross-sectional views taken lines X-X' of (i) of FIGS. 1 to 5.

FIGS. 6 to 9 are cross-sectional views illustrating a method of manufacturing a semiconductor device according to another exemplary embodiment of the inventive concept. Here, the cross-sectional views of the semiconductor device according to another exemplary embodiment of the inventive concept is the same as those of the semiconductor device according to an exemplary embodiment of the inventive concept and (ii) of FIGS. 1 to 5 will be referred.

A method of manufacturing a semiconductor device according to an embodiment of the present invention is performed as follows.

An underlying layer (102, 104) is formed over a substrate (100). A photoresist pattern (108) is formed over the underlying layer to define a first pattern (110) having a first pattern size D1. See FIG. 2.

The first pattern (110) is filled with a copolymer including a hydrophobic component and a hydrophilic component. See FIG. 2. The copolymer is subject to a self-assembling process to form a hydrophobic pattern (110b) in the middle of the first pattern (110) and a hydrophilic pattern (110a) surrounding the hydrophobic pattern (110b). See FIG. 3.

In this particular embodiment, the photoresist pattern (108) is hydrophilic. In alternative embodiments where the photoresist pattern (108) is hydrophobic, in the self-assembling process the locations of the hydrophobic pattern and the hydrophilic pattern are switched. That is, the hydrophilic pattern is formed in the middle of the first pattern (110) and a hydrophobic pattern is formed to surround the hydrophilic pattern.

The self-assembling process may performed by baking the copolymer. The first pattern (110) may be a hole pattern or a line pattern.

After the self-assembling process, the hydrophobic pattern (110b) in the middle of the first pattern (110) is removed to form a second pattern (112) having a second pattern size D2. See FIGS. 3-4. The second pattern size D2 is smaller than the first pattern size D1. The second pattern size D2 may be substantially a half or less of the first pattern size D1. The second pattern (112) may be a hole pattern or a line pattern.

Hereinafter, a method according to an embodiment according to the present invention will be described in more detail in reference to FIGS. 1 to 5.

Figure 1:
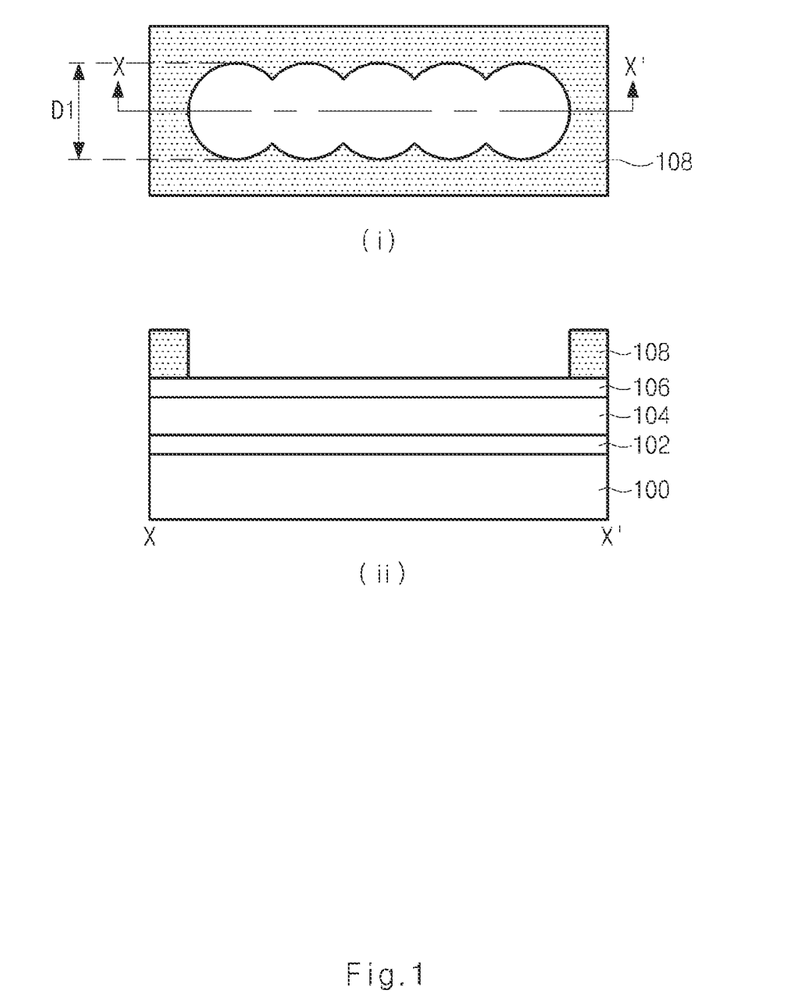
FIGS. 1 to 5 are cross-sectional views illustrating a method of manufacturing a semiconductor device according to an exemplary embodiment of the inventive concept, wherein (i)

First, referring to FIG. 1, an amorphous carbon layer 102 is formed on a semiconductor substrate 100 and a polysilicon layer 104 is formed on the amorphous carbon layer 102. Here, the amorphous carbon layer 102 may be formed to a thickness of 1000 Å to 1500 Å and the polysilicon layer 104 may be formed to a thickness of 200 Å to 500 Å.

Alternatively, in the place of the polysilicon layer 104 a silicon oxynitride (SiON) layer may be formed on the amorphous carbon layer 102. The layer formed on the amorphous carbon layer 102 is not limited to the above-described layers and may include a stack structure of a plasma enhanced tetraethyl orthosilicate (TEOS) layer and a silicon oxide layer.

Subsequently, a bottom antireflective coating (BARC) layer 106 is formed on the polysilicon layer 104 and a photoresist layer is coated on the BARC layer 106. At this time, the BARC layer 106 may be formed to a thickness of 200 Å to 300 Å.

Figure 6:
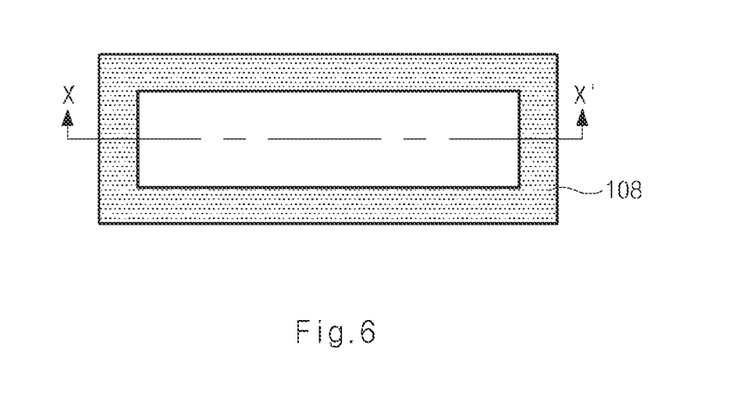
FIGS. 6 to 9 are cross-sectional views illustrating a method of manufacturing a semiconductor device according to another exemplary embodiment of the inventive concept.

Subsequently, an exposure and development process using an exposure mask including contact holes is performed to form a photoresist pattern 108. At this time, the photoresist pattern 108 may include a contact hole type. The photoresist pattern may be formed to have a width (D1). This width may, for example, be twice larger than a pitch of a contact hole to be finally implemented. The photoresist pattern 108 may be formed to connect adjacent contact holes which are arranged along an X-axis (X-X'). However, the photoresist pattern is not limited to the contact hole type and may include a rectangular pattern as shown in FIG. 6.

Figure 2:
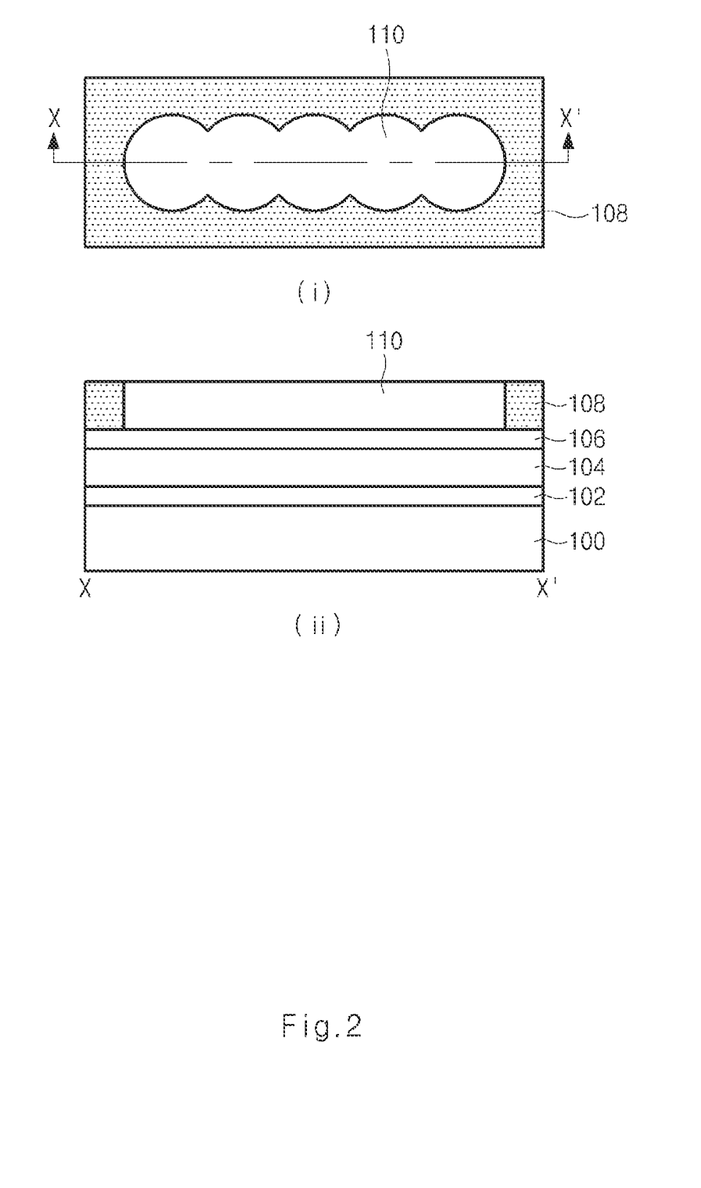
Figure 7:
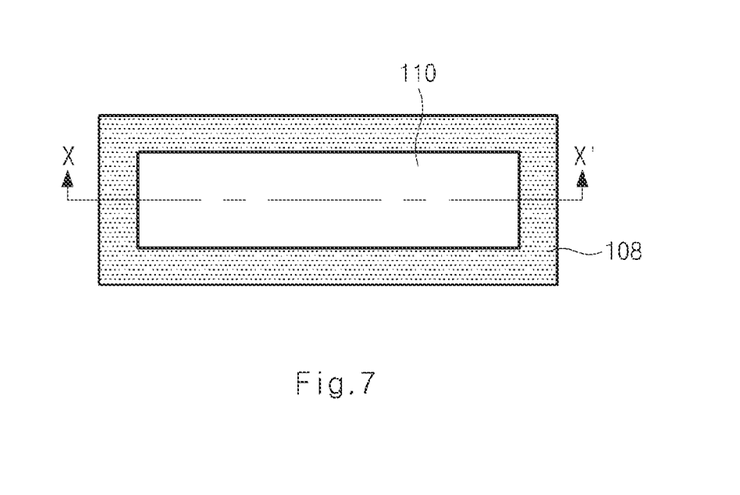

Referring to FIGS. 2 and 7, a block copolymer 110 comprising a polymer having a hydrophilic radical and a polymer having a hydrophobic radical is formed on the photoresist pattern 108.

Figure 3:
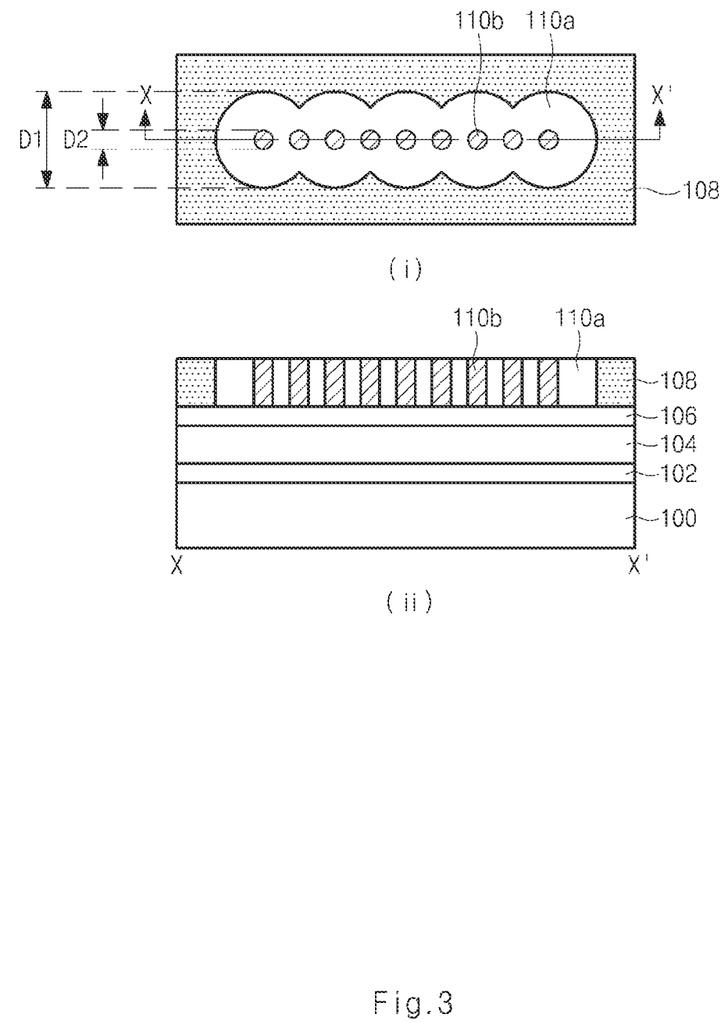
Figure 8:
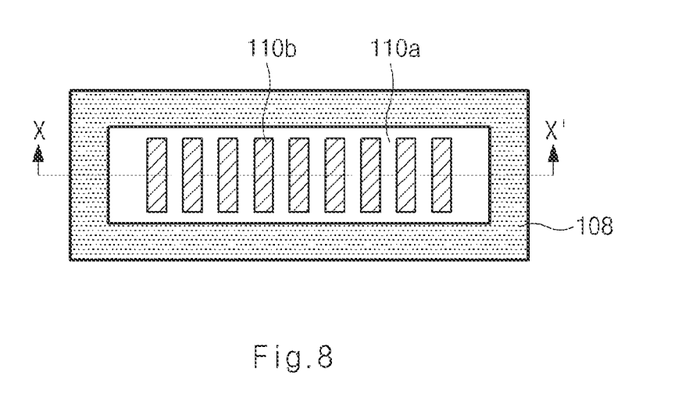

Referring to FIGS. 3 and 8, heat is applied to the block copolymer 110 to cause the block copolymer 110 to be self-assembled. At this time, the self assembly process may be performed through a bake process at a temperature of 100° C. to 200° C. By the self-assembly process, polymer 110a having the hydrophilic radical is arranged along a sidewall of the photoresist pattern 108 and polymers 110b having the hydrophobic radical are arranged in the polymers 110a having the hydrophilic radical.

When viewed in a cross-section, the polymers 110a having the hydrophilic radical are arranged to be spaced apart from each other at the same interval, and the polymers 110b having the hydrophobic radical are arranged between the polymers 110a having the hydrophilic radical. That is, as shown in FIG. 3(i), the polymers 110b having the hydrophobic radical are arranged within the polymer 110a having the hydrophilic radical so that as shown in FIG. 3(ii), the polymers 110a having the hydrophilic radical and the polymers 110b having the hydrophobic radical are arranged to have the same width. Here, a sum of a width of the polymer 110a having the hydrophilic radical and a width of the polymer 110b having the hydrophobic radical corresponds to a pitch of a contact hole to be finally implemented.

Alternatively, as shown in FIG. 8, when the photoresist pattern 108 has a rectangular type in another exemplary embodiment, the polymer 110a having the hydrophilic radical and the polymer 110b having the hydrophobic radical may be arranged in a line and space type along the line X-X'.

Figure 4:
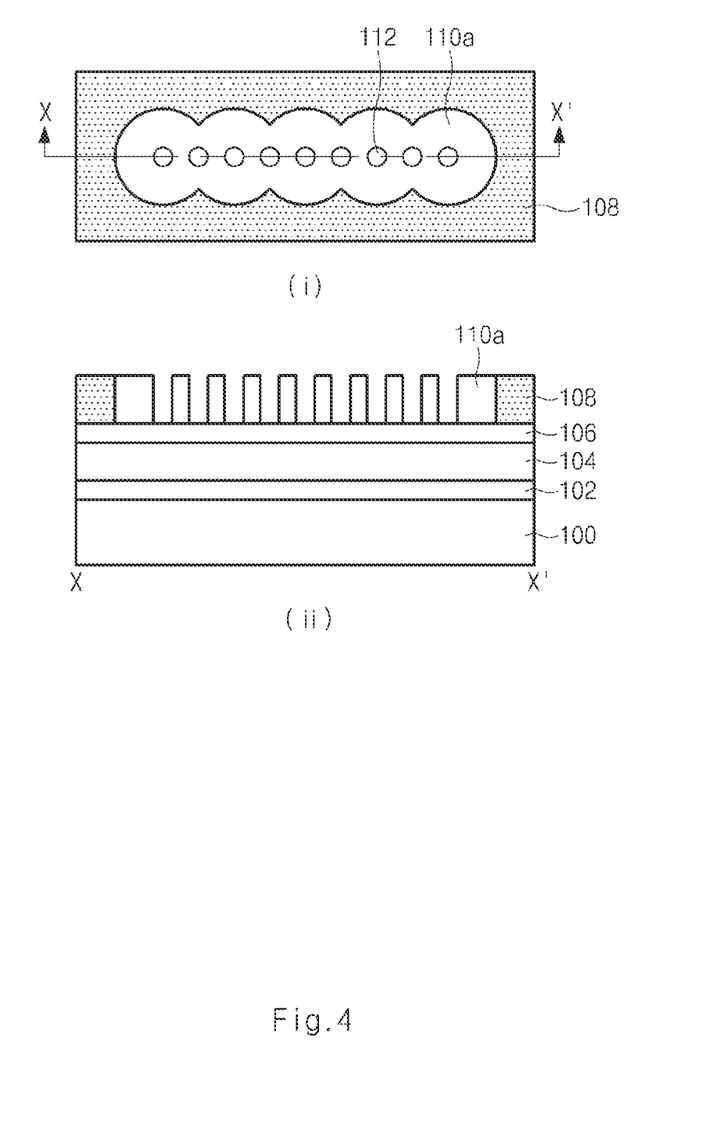
Figure 5:
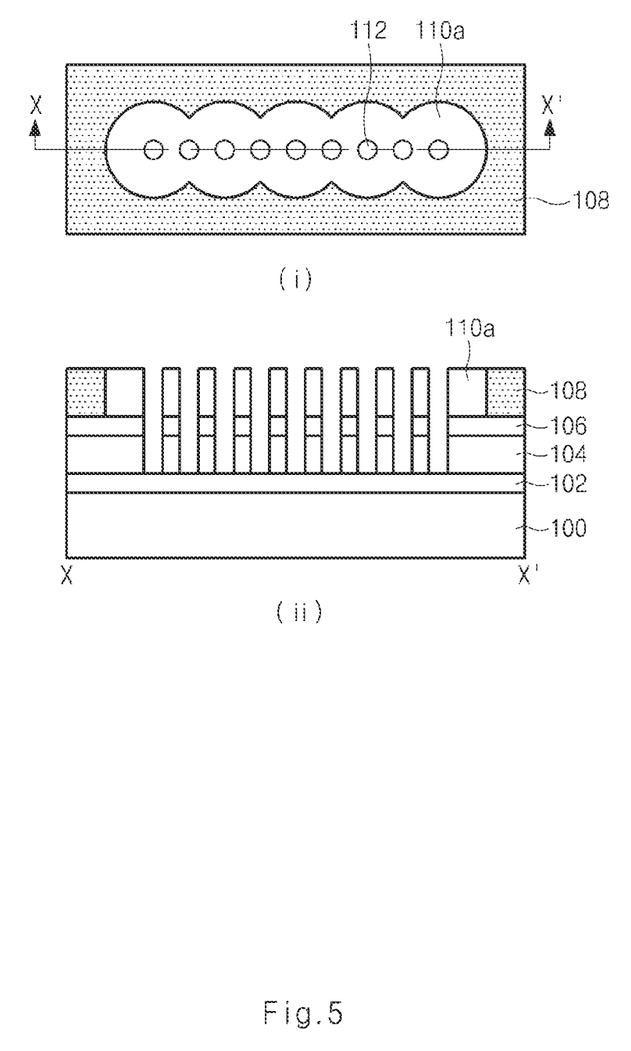
Figure 9:
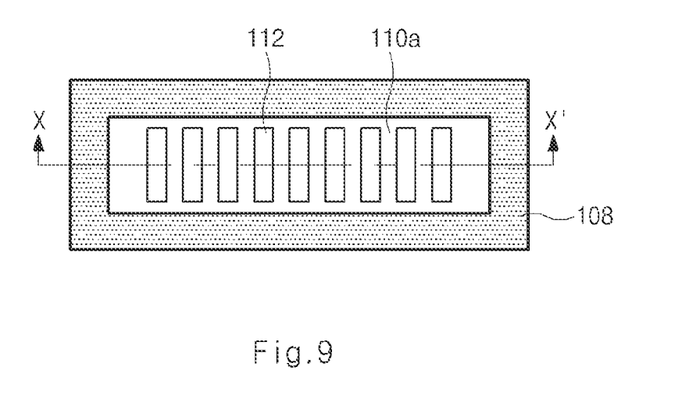

Referring to FIGS. 4, 5 and 9, the polymer 110b having the hydrophobic radical is selectively removed so that the polymer 110a having the hydrophilic radical remains. The selectively removing the polymer 110b having the hydrophobic radical, may be performed using a different etch selectivity between the polymer 110a having the hydrophilic radical and the polymer 110b having the hydrophobic radical.

The underlaying BARC layer 106, polysilicon layer 104, and amorphous carbon layer 102 are etched using a region in which the polymer 110b having the hydrophobic radical is removed as a mask, thereby defining a contact hole to be finally implemented. The contact holes formed according to the exemplary embodiment of the inventive concept are spaced at a uniform interval, so that it is possible to overcome the problem that the contact holes are not spaced apart at a uniform width in the related art. This allows a fine contact hole to be more readily formed as compared to a contact hole pattern formed using an exposure mask in the related art.

Alternatively, as shown in FIGS. 6-9, when the polymer 110a having the hydrophilic radical and the polymer 110b having the hydrophobic radical are arranged in a line and space type in another exemplary embodiment, the underlying BARC layer 106, polysilicon layer 104, and the amorphous carbon layer 102 are etched using a region 112 in which the polymer 110b having the hydrophobic radical is selectively removed as a mask. This defines a line and space pattern to be finally implemented. The line and space patterns formed according to another exemplary embodiment of the inventive concept are spaced at a uniform width so that the fine line and space pattern can be easily formed compared to the line and space pattern formed using an exposure mask in the related art.

According to the above-described exemplary embodiment of the inventive concept, heat may be is applied to the (block) copolymer so that the polymer having the hydrophilic radical and the hydrophobic radical is self-assembled, with the polymer having the hydrophobic radical arranged between the polymers having the hydrophilic radical. Then, the polymer having the hydrophobic radical is selectively removed to implement contact holes that are uniformly spaced and which have a fine size.

The above embodiments of the present invention are illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a semiconductor device, comprising:
    forming a layer to be etched over a semiconductor substrate;
    forming a photoresist pattern over the layer to be etched;
    forming in the photoresist pattern, a block copolymer including a hydrophobic radical and a hydrophilic radical;
    assembling the block copolymer such that the polymer having the hydrophobic radical forms a pillar pattern within the polymer having the hydrophilic radical; and
    selectively removing the polymer having the hydrophobic radical.

2. The method of claim 1, wherein the forming the layer to be etched comprises:
    forming an amorphous carbon layer on the semiconductor substrate; and
    forming a polysilicon layer on the amorphous carbon layer.

3. The method of claim 1, the method further comprising forming an antireflective coating (ARC) layer on the layer to be etched after the forming the layer to be etched.

4. The method of claim 1, wherein the photoresist pattern includes a contact hole pattern.

5. The method of claim 4, wherein the forming the photoresist pattern includes forming the photoresist pattern to connect to adjacent contact hole patterns.

6. The method of claim 4, wherein the pillar pattern includes a circular pattern.

7. The method of claim 6, wherein the forming the photoresist pattern includes coating a photoresist layer over the layer to be etched, and performing an exposure and development process using an exposure mask.

8. The method of claim 1, wherein the photoresist pattern includes a rectangular ring pattern.

9. The method of claim 8, wherein the pillar pattern includes a line pattern.

10. The method of claim 1, wherein the assembling the block copolymer includes performing a bake process at a temperature of between about 100° C. to 200° C.

11. The method of claim 1, the method further comprising forming a final pattern by etching the layer to be etched using the polymer having the hydrophilic radical as a mask, after the selectively removing the hydrophobic polymer.

12. A method of manufacturing a semiconductor device, comprising:
    forming an underlying layer over a substrate;
    forming a photoresist pattern over the underlying layer to define a first pattern having a first pattern size D1;
    filling the first pattern with a copolymer including a hydrophobic component and a hydrophilic component; and
    subjecting the copolymer to a self-assembling process to form a hydrophobic pattern in the middle of the first pattern and a hydrophilic pattern surrounding the hydrophobic pattern.

13. The method of claim 12,
    wherein the step of subjecting the copolymer to a self-assembling process includes baking the copolymer.

14. The method of claim 12,
    Wherein the first pattern is a hole pattern or a line pattern.

15. The method of claim 12, the method further comprising:
    removing the hydrophobic pattern in the middle of the first pattern to form a second pattern having a second pattern size D2,
    wherein the second pattern size D2 is smaller than the first pattern size D1.

16. The method of claim 15,
    wherein the second pattern size D2 is substantially a half or less of the first pattern size D1.

17. The method of claim 15,
    wherein the second pattern is a hole pattern or a line pattern.

* * * * *